(12) United States Patent
Choi et al.

(10) Patent No.: US 7,576,355 B2
(45) Date of Patent: Aug. 18, 2009

(54) ELECTRONIC DEVICE, FIELD EFFECT TRANSISTOR INCLUDING THE ELECTRONIC DEVICE, AND METHOD OF MANUFACTURING THE ELECTRONIC DEVICE AND THE FIELD EFFECT TRANSISTOR

(75) Inventors: Jun-hee Choi, Yongin-si (KR); Andrei Zoulkarneev, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 123 days.

(21) Appl. No.: 11/896,910

(22) Filed: Sep. 6, 2007

(65) Prior Publication Data
US 2008/0230769 A1 Sep. 25, 2008

(30) Foreign Application Priority Data
Nov. 2, 2006 (KR) ...................... 10-2006-0107933

(51) Int. Cl.
*H01L 29/06* (2006.01)
(52) U.S. Cl. ..................... 257/41; 257/40; 257/213; 257/39; 257/E51.005; 257/E51.04; 257/E51.023; 438/99; 438/100; 438/2; 977/936; 977/938

(58) Field of Classification Search .................. 257/41, 257/40, 213, 39, E51.005, E51.04, E51.023; 438/99, 100, 2; 977/936, 938
See application file for complete search history.

(56) References Cited

U.S. PATENT DOCUMENTS
7,087,920 B1 * 8/2006 Kamins ........................ 257/2

\* cited by examiner

*Primary Examiner*—Tu-Tu V Ho
(74) *Attorney, Agent, or Firm*—Harness, Dickey & Pierce, P.L.C.

(57) ABSTRACT

Provided is an electronic device, a field effect transistor having the electronic device, and a method of manufacturing the electronic device and the field effect transistor. The electronic device includes: a substrate; a first electrode and a second electrode which are formed in parallel to each other on the substrate, each of the first electrode and the second electrode comprising two electrode pads separated from each other and a heating element that connect the two electrode pads; a catalyst metal layer formed on the heating element of the first electrode; and a carbon nanotube connected to the second electrode by horizontally growing from the catalyst metal layer; wherein the heating elements are separated from the substrate by etching the substrate under the heating elements of the first and the second electrodes.

27 Claims, 10 Drawing Sheets

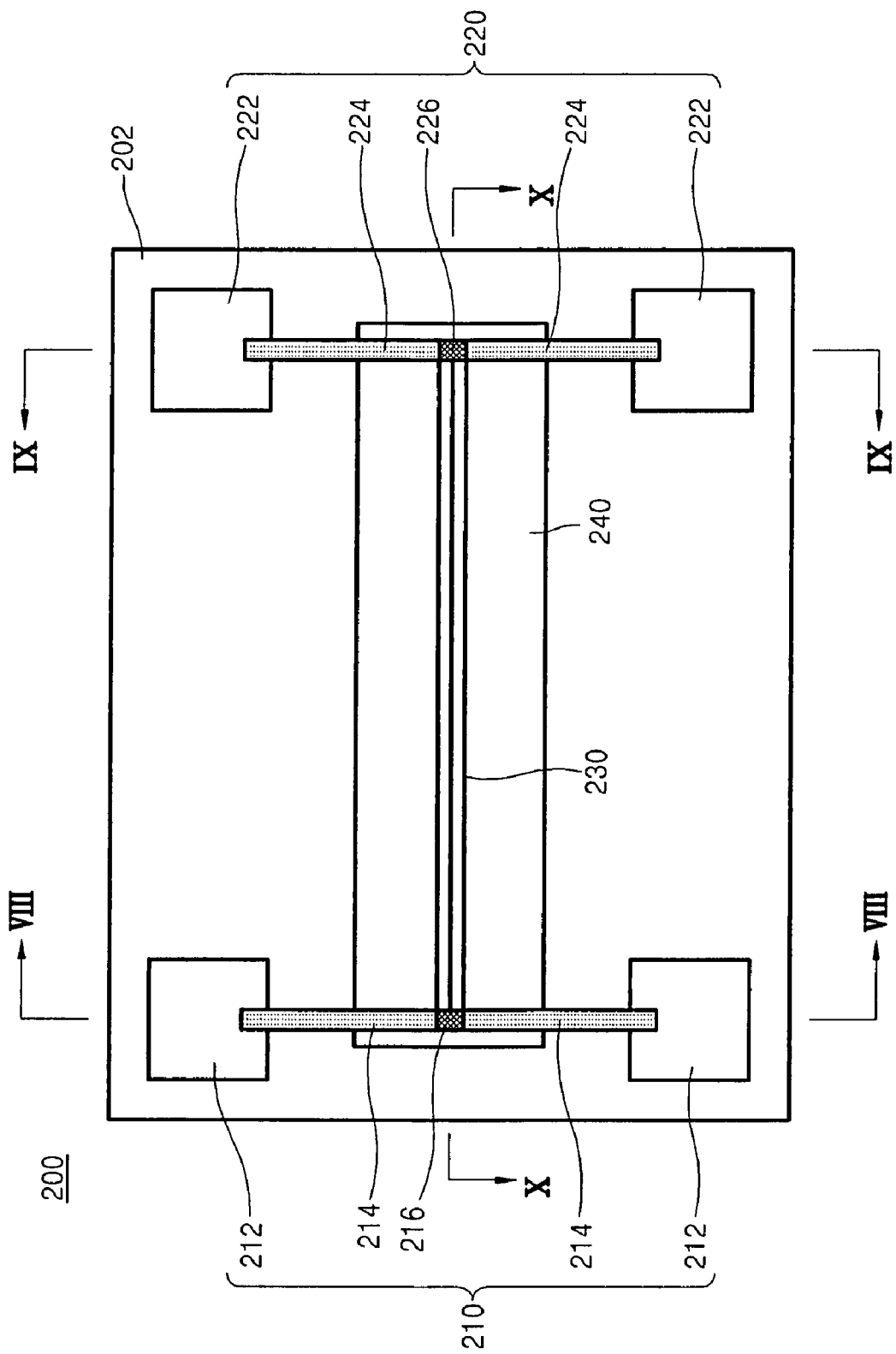

ELECTRONIC DEVICE, FIELD EFFECT TRANSISTOR INCLUDING THE ELECTRONIC DEVICE, AND METHOD OF MANUFACTURING THE ELECTRONIC DEVICE AND THE FIELD EFFECT TRANSISTOR

CROSS-REFERENCE TO RELATED PATENT APPLICATION AND CLAIM OF PRIORITY

This application claims the benefit of Korean Patent Application No. 10-2006-0107933, filed on Nov. 2, 2006, in the Korean Intellectual Property Office, the disclosure of which is incorporated herein in its entirety by reference.

BACKGROUND OF THE INVENTION

1. Field of the Invention

The present invention relates to an electronic device, a field effect transistor, and a method of manufacturing the electronic device, and more particularly, to an electronic device that includes carbon nanotubes horizontally grown from a catalyst layer formed a heating element formed in an electrode, a field effect transistor having the electronic device, and a method of manufacturing the electronic device and the field effect transistor.

2. Description of the Related Art

Carbon nanotubes are potentially useful in a variety of applications since they have good mechanical and chemical characteristics, high electrical conductivity, and can be easily grown to a diameter from a few nanometers or a few tens nanometers to a micrometers unit. Thus, research on the application of carbon nanotubes in various fields has been actively conducted. For example, the application of the carbon nanotubes are expanded in emission devices, optical switches for optical communication, or bio devices.

Carbon nanotubes can be formed by an arc discharge method, a laser ablation method, a chemical vapor deposition method, a screen printing method, and a spin coating method, and these methods are well known in the art.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides an electronic device that includes carbon nanotubes horizontally grown from a heating element formed on an electrode, and a field effect transistor having the electronic device.

The present invention also provides a method of manufacturing the electronic device and the field effect transistor.

According to an aspect of the present invention, there is provided an electronic device comprising: a substrate; a first electrode formed on the substrate, the first electrode comprising: a couple of first electrode pads separated from each other; a first heating element that connects the couple of the first electrode pads to each other, the first heating element separated from the substrate; and a catalyst layer formed on the first heating element of the first electrode; a second electrode formed on the substrate, the second electrode being in parallel to the first electrode, the second electrode comprising: a couple of second electrode pads separated from each other; and a second heating element that connects the couple of the second electrode pads to each other, the second heating element separated from the substrate; and a carbon nanotube grown from the catalyst layer, the carbon nanotube connecting the first electrode and the second electrode.

The electronic device may further comprise a fixing layer which may be made of a low melting point material, particularly, a low melting point metal for fixing the carbon nanotube horizontally grown from the connected to an end of the carbon nanotube on the second heating element of the second electrode.

The low melting point metal layer may be formed of Al or Cu.

The first and second heating elements may be formed of a material selected from the group consisting of Mo, W, SiC, and $MoSi_2$.

Each of the first and the second electrodes may be formed in one unit using one metal.

The carbon nanotube may be a single walled-carbon nanotube.

According to another aspect of the present invention, there is provided a field effect transistor comprising the electronic device which further comprises a gate electrode formed on the substrate.

According to still another aspect of the present invention, there is provided a method of manufacturing an electronic device, comprising: (a) forming a first electrode and a second electrode which are parallel to each other on a substrate, the first electrode comprising a couple of first electrode pads and a first heating element connecting the couple of the first electrode pads to each other, the second electrode comprising a couple of second electrode pads and a second heating element connecting the couple of the second electrode pads to each other; (b) forming a catalyst layer on the first heating element of the first electrode; (c) etching at least a portion of the substrate under the first and second heating elements of the first and second electrodes; (d) forming an electric field directed from the first electrode towards the second electrode by respectively applying a predetermined voltage to each of the first and second electrode pads of the first and second electrodes in order to generate heat from the first heating element to heat the catalyst layer to a first temperature; and (e) growing a carbon nanotube from the catalyst layer using a gas containing carbon atoms to be connected to the second electrode.

The operation (b) may further comprise forming a fixing layer on the second heating element of the second electrode to fix the end of the carbon nanotube grown from the catalyst layer; and the operation (d) further comprises heating the fixing layer to a second temperature which is lower than a melting point of the fixing layer. The operation (e) may comprise fixing the carbon nanotube on the fixing layer such that an end of the carbon nanotube contacts the fixing layer.

The operation (d) may comprise forming an electric field having an intensity of 1 V/μm or higher.

In the operation (d), the first temperature may be approximately 900 to 1,000° C., and the operation (e) may comprise forming a single-walled carbon nanotube.

According to still further another aspect of the present invention, there is provided a method of manufacturing a field effect transistor, comprising: (a) forming a gate electrode on a substrate; (b) forming a first electrode and a second electrode which are parallel to each other on the substrate, the first electrode comprising a couple of first electrode pads and a first heating element connecting the couple of the first electrode pads to each other, the second electrode comprising a couple of the second electrode pads and a second heating element connecting the couple of the second electrode pads; (c) forming a catalyst layer on the first heating element of the first electrode; (d) etching at least a portion of the substrate under the first and second heating elements of the first and second electrodes; (e) forming an electric field directed from the first electrode towards the second electrode by applying a respective predetermined voltage to each of the first and second electrode pads of the first and second electrodes in order to generate heat from the first heating element to heat the catalyst layer to a first temperature; and (f) growing a carbon nanotube from the catalyst layer using a gas containing carbon atoms to be connected to the second electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 7 is a plan view illustrating a field effect transistor according to another embodiment of the present invention;

DETAILED DESCRIPTION OF THE INVENTION

An electronic device and a field effect transistor according to embodiments of the present invention will now be described more fully with reference to the accompanying drawings in which exemplary embodiments of the invention are shown.

Figure 1:
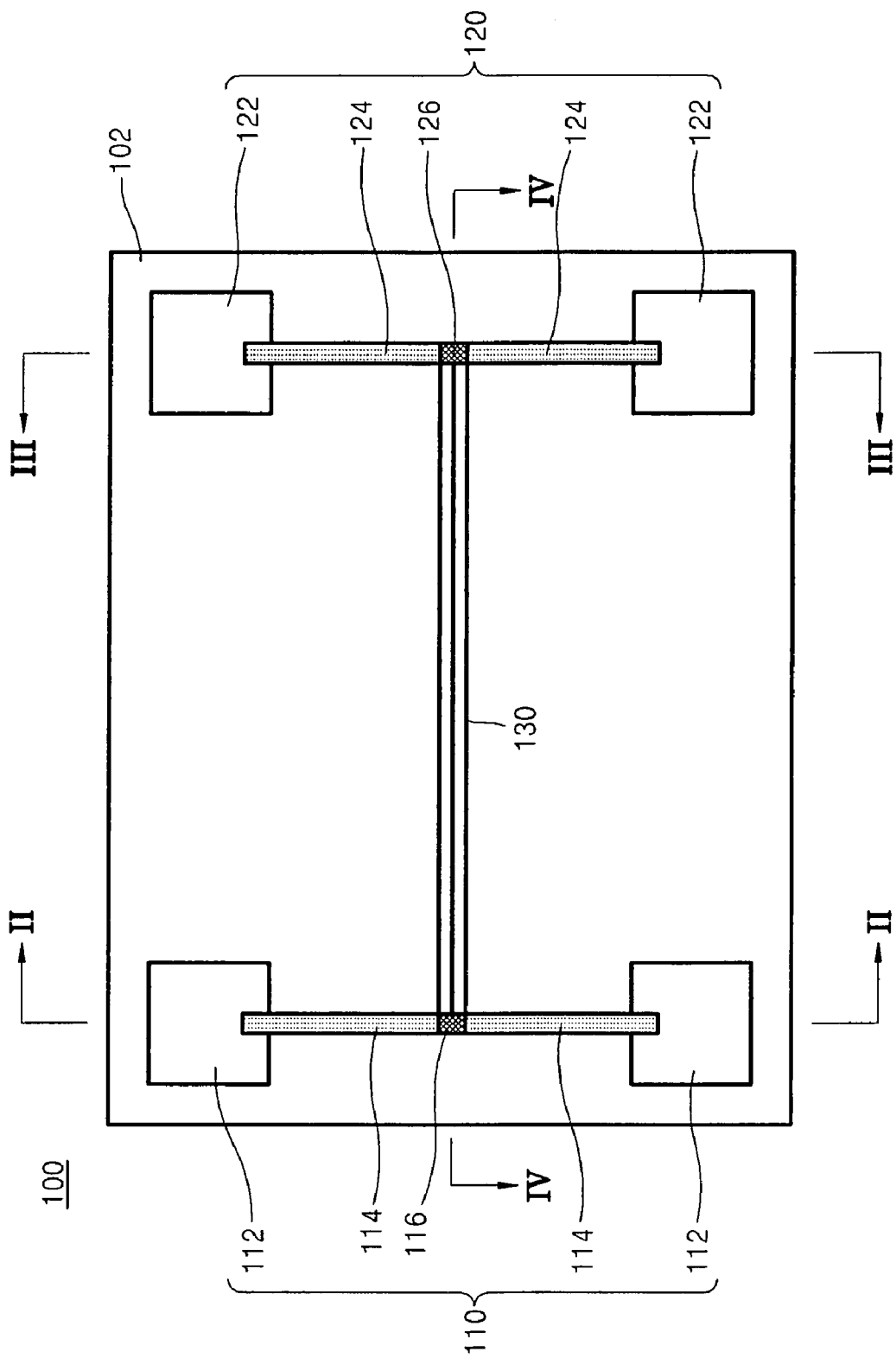
FIG. 1 is a plan view illustrating an electronic device according to an embodiment of the present invention.
Figure 2:
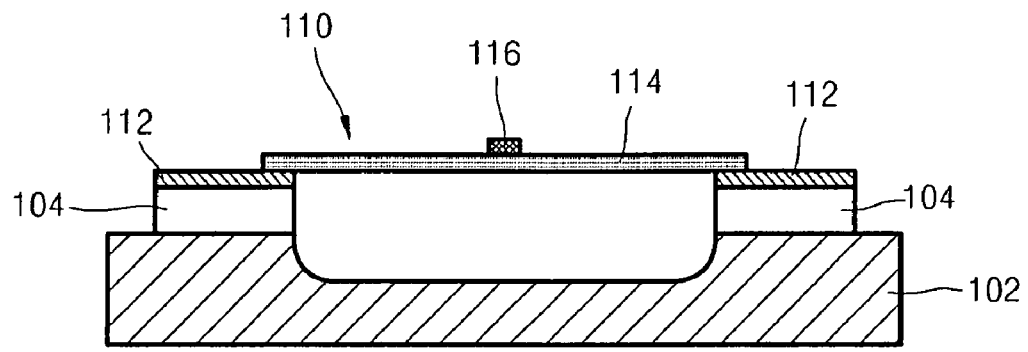
FIGS. 2 through 4 are cross-sectional views taken along lines II-II, III-III, and IV-IV of FIG. 1, respectively.
Figure 3:
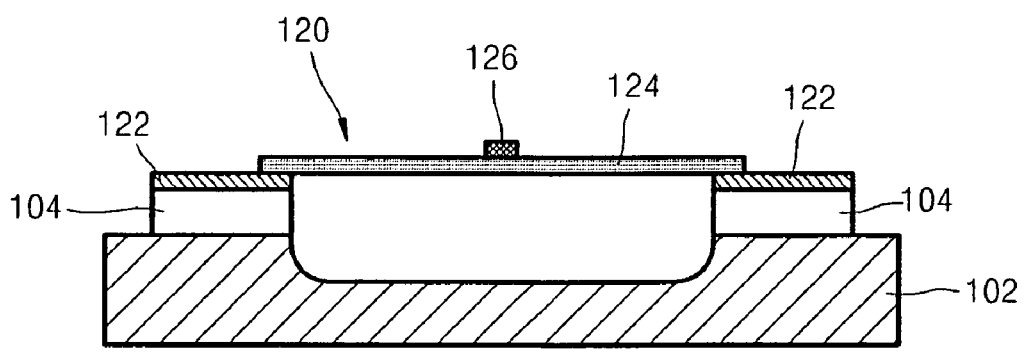
Figure 4:
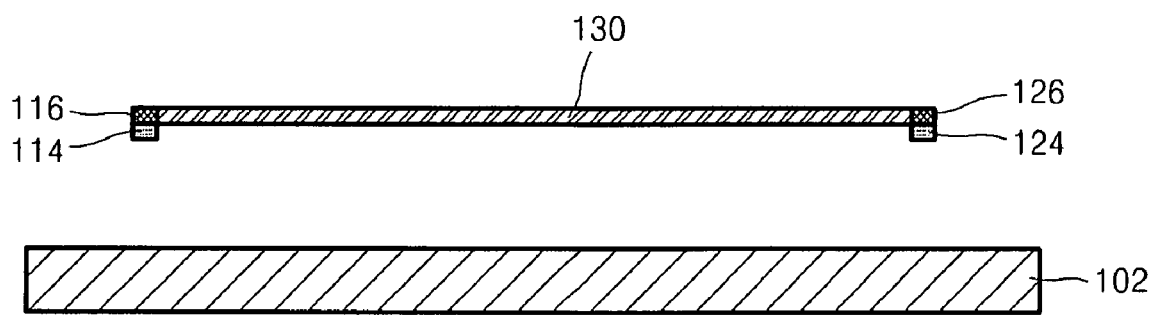

FIG. 1 is a plan view illustrating an electronic device 100 according to an embodiment of the present invention. FIGS. 2 through 4 are cross-sectional views taken along lines II-II, III-III, and IV-IV of FIG. 1.

Referring to FIG. 1, the electronic device 100 includes a first electrode 110 and a second electrode 120 formed in parallel on a substrate 102 and a carbon nanotube 130 that connects the first and the second electrodes 110 and 120.

Referring to FIGS. 1 and 2, the first electrode 110 includes two electrode pads 112 separated from the substrate 102 by an insulating layer 104 and a heating element 114 that connects the two electrode pads 112. A catalyst layer, which may be a catalyst metal layer 116 for growing the carbon nanotube 130 is formed on the heating element 114.

The heating element 114 can be formed of one of Mo, W, SiC, and $MoSi_2$. Heat is generated according to Joule's law (Joule's heat) from the heating element 114 by applying a predetermined voltage to the electrode pads 112 connected to the heating element 114, and the Joule's heat heats the catalyst layer 116.

The substrate 102 under the heating element 114 is isotropically etched. The isotropical etching of the substrate 102 allows the heating element 114 to be separated from the substrate 102. Therefore, waste of Joule's heat generated at the heating element 114 through the substrate 102 is prevented.

The carbon nanotube 130 is grown from the catalyst metal layer 116, and may be a single-walled carbon nanotube grown at a temperature of approximately 900 to 1,000° C.

Referring to FIGS. 1 and 3, the second electrode 120 includes two electrode pads 122 separated from the substrate 102 by the insulating layer 104 and a heating element 124 that connects the two electrode pads 122. A fixing layer, which may be a low melting point metal layer 126 formed of a low melting point metal which has a melting point of about 400 to 700° C., for example, Al or Cu is formed on the heating element 124. If the low melting point metal layer 126 is formed of, for example, Al, the low melting point metal layer 126 has adhesiveness at a temperature lower than the melting point thereof by approximately 50 to 100° C., and fixes the carbon nanotube 130 by contacting an end of the carbon nanotube 130 grown from the catalyst metal layer 116.

The heating element 124 may be formed of the same material for forming the heating element 114. Joule's heat is generated from the heating element 124 by applying a predetermined voltage to the electrode pads 122 connected to the heating element 124, and the Joule's heat heats the low melting point metal layer 126.

The substrate 102 under the heating element 124 is isotropically etched. The isotropical etching of the substrate 102 allows the heating element 124 to be separated from the substrate 102.

Referring to FIGS. 1 and 4, the heating element 114 heated to a predetermined temperature, for example, 1,000° C. on the substrate 102 horizontally grows the carbon nanotube 130 from the catalyst metal layer 116 using a gas containing carbon atoms. At this point, the low melting point metal layer 126 formed of Al which is heated to a temperature of approximately 400 to 450° C. by the heating element 124 is in a state just before melting, and contacts an end of the grown carbon nanotube 130. Thus, in a cooling process, the low melting point metal layer 126 fixes the carbon nanotube 130 on the heating element 124. At this point, an electric field is formed from the catalyst metal layer 116 to the low melting point metal layer 126 by applying a voltage to the electrode pads 112 and 122, and the electric field horizontally grows the carbon nanotube 130 from the catalyst metal layer 116 to contact the low melting point metal layer 126.

Figure 5:
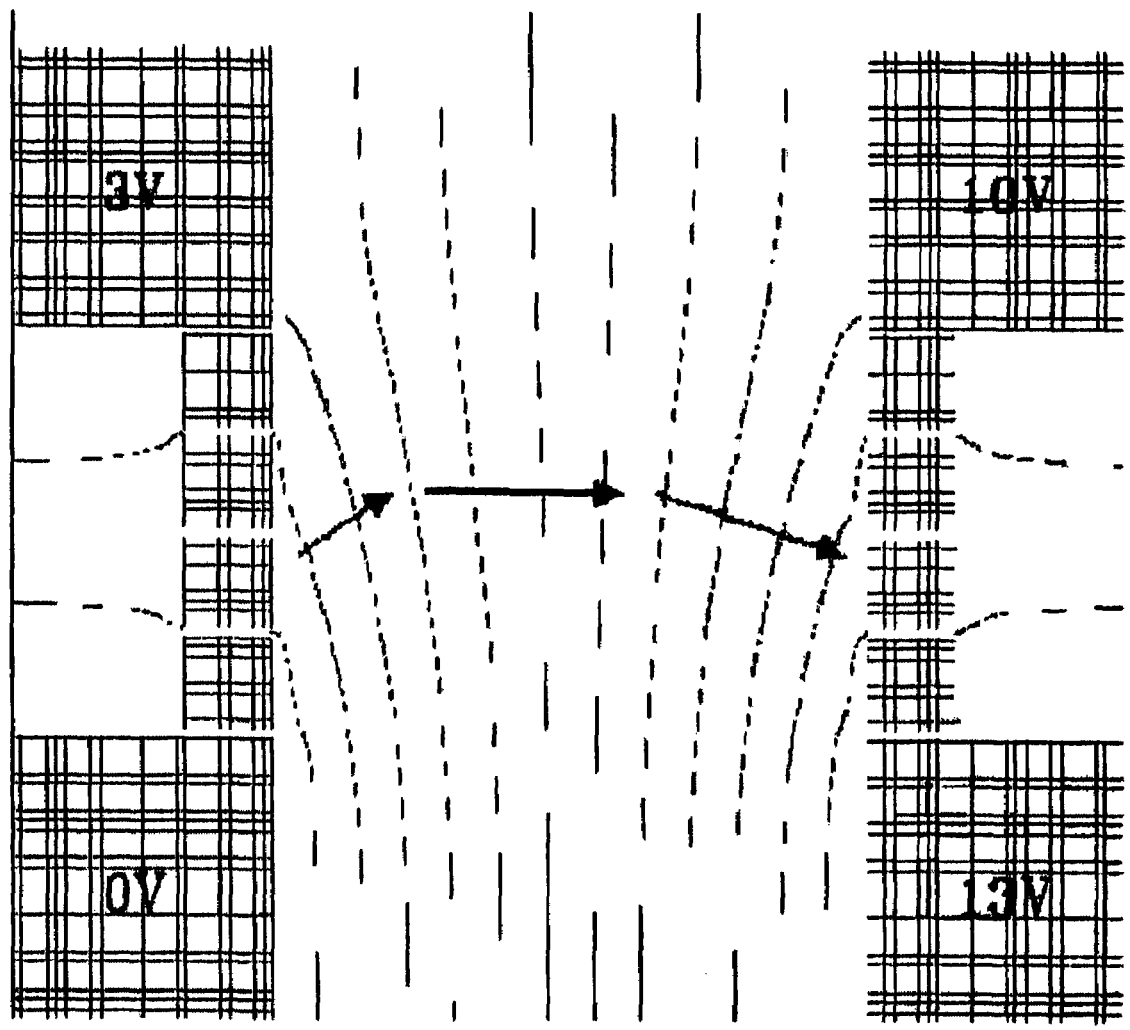
FIG. 5 is a schematic drawing showing equipotential lines of an electric field when predetermined voltages are respectively applied to electrode pads of the electronic device of FIG. 1.

FIG. 5 is a schematic drawing showing equipotential lines of an electric field when predetermined DC or pulse voltages are respectively applied to the electrode pads 112 and 122 of FIG. 1. The electric field is applied in a direction perpendicular to a line between the two equipotential lines, that is, the directions indicated by the arrows in FIG. 5. The direction of the electric field is also the growing direction of the carbon nanotube 130. The electrode pads 112 of the first electrode 110 and the electrode pads 122 of the second electrode 120 are separated by a distance of approximately 10 μm, and the intensity of the electric field between the first and second electrodes 110 and 120 is approximately 1V/μm.

FIG. 6A through 6F are cross-sectional views illustrating a method of manufacturing an electronic device according to an embodiment of the present invention. Like reference numerals are used to indicate elements that are substantially identical to the elements of FIGS. 1 through 4, and thus the detailed description thereof will not be repeated.

Figure 6A:
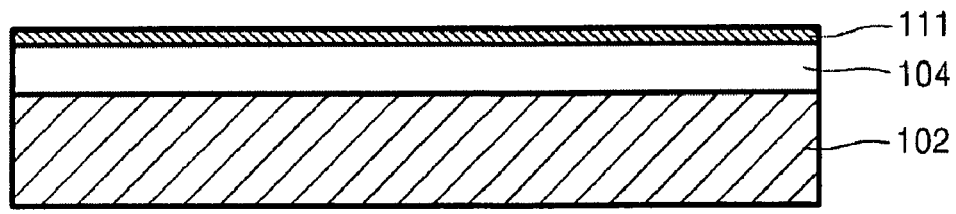
FIG. 6A through 6F are cross-sectional views illustrating a method of manufacturing an electronic device according to an embodiment of the present invention.

Referring to FIG. 6A, a substrate 102, for example, a silicon substrate or a glass substrate is prepared. An insulating layer 104 and an electrode layer 111 are stacked on the substrate 102. The electrode layer 111 can be formed of Al, Cr, Mo, or W.

Figure 6B:
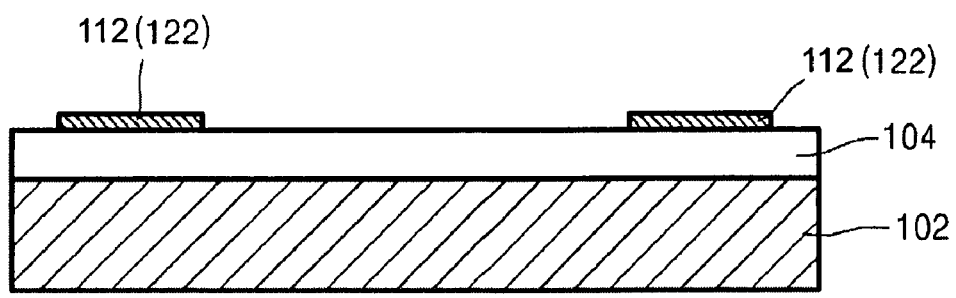

Referring to FIG. 6B, electrode pads 112 and 122 of the first and the second electrodes 110 and 120, respectively, are formed by patterning the electrode layer 111.

Figure 6C:
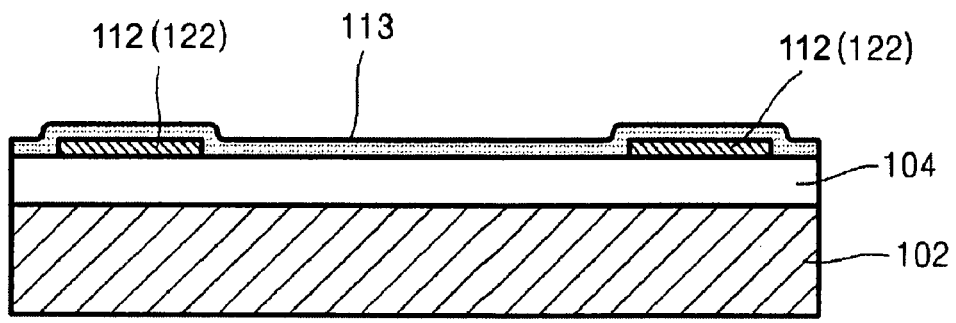

Referring to FIG. 6C, a heater layer 113 covering the electrode pads 112 and 122 is formed on the insulating layer 104. The heater layer 113 can be formed of Mo, W, SiC, or $MoSi_2$. In this case, the heater layer 113 is formed of a material having wet etch selectivity with respect to a material for forming the electrode layer 111. For example, when the electrode layer 111 is formed of Cr, the heater layer 113 can be formed of Mo. Also, when the electrode layer 111 formed of Al, the heater layer 113 can be formed of $MoSi_2$.

Figure 6D:
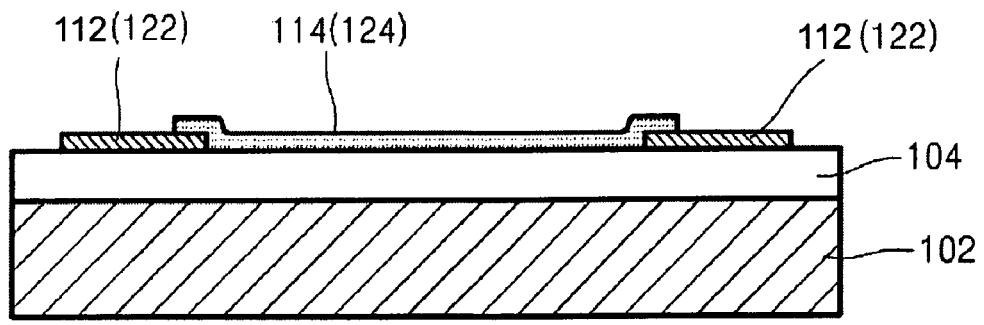

Referring to FIG. 6D, heating elements 114 and 124 that respectively connect the two electrode pads 112 or 122 are formed by patterning the heater layer 113.

Figure 6E:
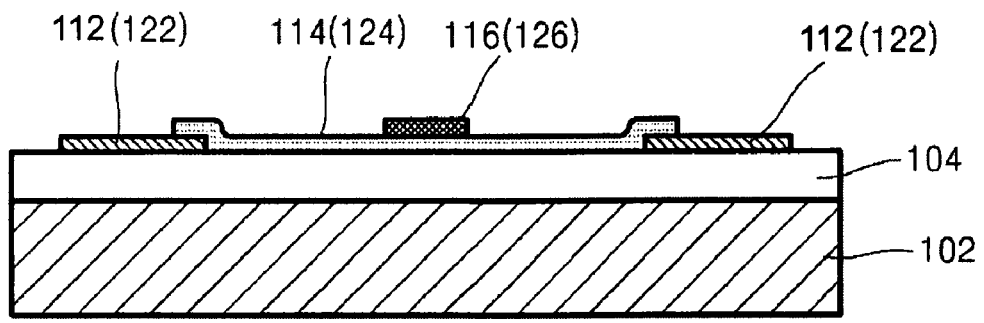

Referring to FIG. 6E, after a metal layer for catalyst (not shown) is formed on the substrate 102 using a sputtering or e-beam evaporation method, a catalyst metal layer 116 is formed on the heating element 114 by patterning the metal layer for catalyst. The catalyst metal layer 116 can be formed of Ni, Fe, Co, or an alloy of these metals.

Next, after a metal layer having low melting point (not shown) is formed on the substrate 102 using a sputtering or e-beam evaporation method, a low melting point metal layer 126 is formed on the heating element 124 by patterning the metal layer having low melting point. The low melting point metal layer 126 can be formed of Al or Cu. If the low melting point metal layer 126 does not have wet etch selectivity with respect to the electrode pads 112 and 122 and the heating elements 114 and 124, after a mask that exposes a region for forming the low melting point metal layer 126 is formed in advance, the metal layer having low melting point is deposited on the mask, and then, the mask can be lifted-off.

The catalyst metal layer 116 can also be formed using the lift-off process.

Figure 6F:
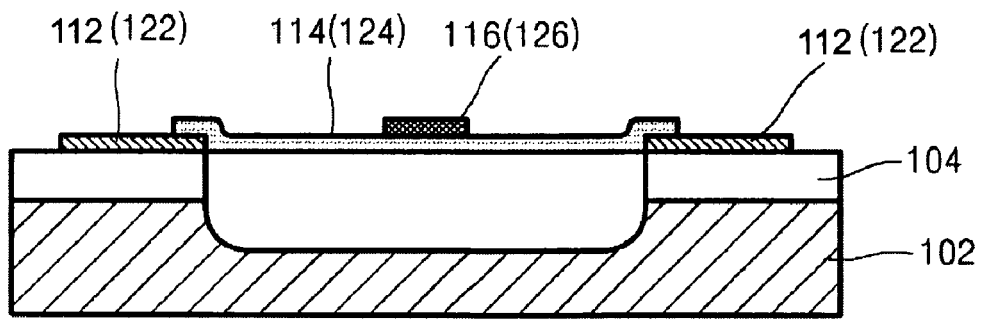

Referring to FIG. 6F, regions of the insulating layer 104 and the substrate 102 between the heating elements 114 and 124 are isotropically etched to a predetermined depth. As a result, the heating elements 114 and 124 are suspended like a bridge. The purpose of the etching is to form a localized heating region by preventing the flow of heat to the insulating layer when a current is applied to the heating elements 114 and 124.

Next, the substrate 102 is placed in a vacuum chamber (not shown). Afterwards, electric fields are formed between the heating elements 114 and 124 by respectively applying a predetermined DC voltage or a pulse voltage to each of the electrode pads 112 and 122 as depicted in FIG. 5. At the same time, the catalyst metal layer 116 on the heating element 114 is maintained at a temperature of approximately 1,000° C., and the low melting point metal layer 126 on the heating element 124 is maintained at a temperature lower than the melting point of the low melting point metal layer 126 by approximately 50 to 100° C. Next, the carbon nanotube 130 is horizontally grown from the catalyst metal layer 116 toward the low melting point metal layer 126 by blowing a hydrogen containing gas, for example, ethylene gas into the vacuum chamber. An end of the grown carbon nanotube 130 is fixed on the low melting point metal layer 126 when the carbon nanotube 130 contacts the low melting point metal layer 126.

The intensity of the electric field between the heating elements 114 and 124 may be approximately 1V/μm or higher.

In the method described above, the heating elements 114 and 124 and the electrode pads 112 and 122 of the first and the second electrodes 110 and 120 are formed of different materials from each other, but the present invention is not limited thereto. That is, when the electrode pads 112 and 122 of the first and the second electrodes 110 and 120 and the heating elements 114 and 124 are formed of the same material, for example, W or Mo, after forming a metal layer on an insulating layer, the electrode pads 112 and 122 and the heating elements 114 and 124 can be formed together by patterning the metal layer.

Figure 8:
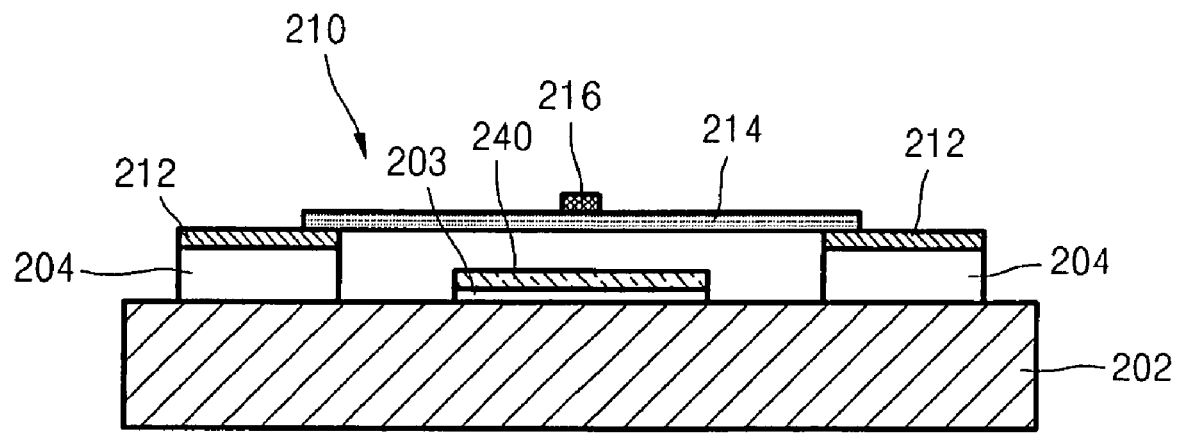
FIGS. 8 through 10 are cross-sectional views taken along lines VIII-VIII, IX-IX, and X-X of FIG. 7, respectively.
Figure 9:
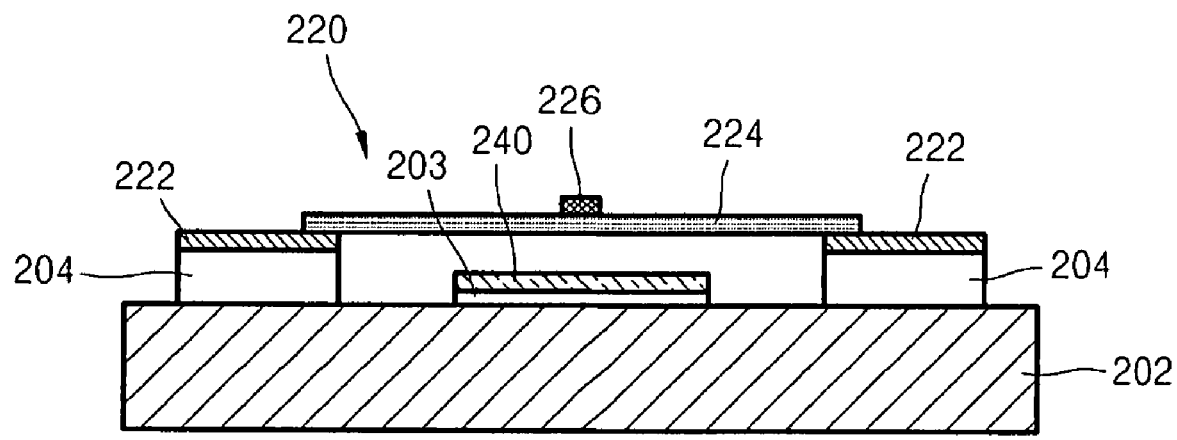
Figure 10:
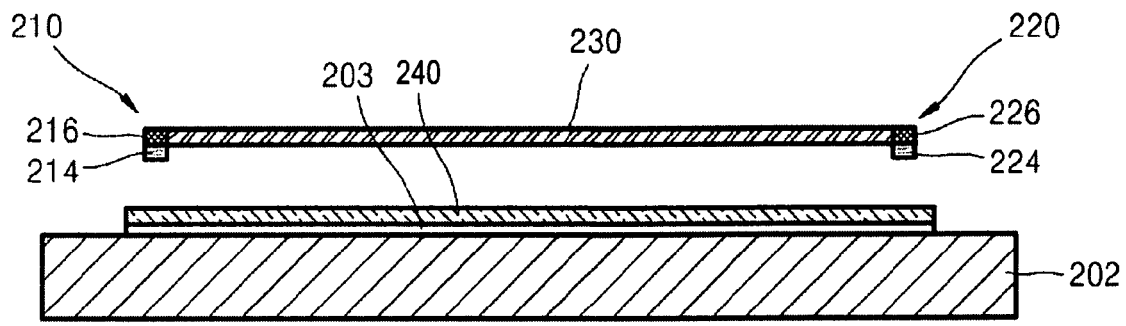

FIG. 7 is a plan view illustrating a field effect transistor 200 according to another embodiment of the present invention, and FIGS. 8 through 10 are cross-sectional views taken along lines VIII-VIII, IX-IX, and X-X of FIG. 7.

Referring to FIG. 7, the field effect transistor 200 includes a first electrode 210 and a second electrode 220 formed in parallel on a substrate 202, a carbon nanotube 230 that connects the first electrode 210 to the second electrodes 220, and a gate electrode 240 located below the carbon nanotube 230. One of the first and the second electrodes 210 and 220 is a source electrode and the other is a drain electrode.

Referring to FIGS. 7 and 8, the first electrode 210 includes two electrode pads 212 separated from the substrate 202 by an insulating layer 204 and a heating element 214 that connects the two electrode pads 212. A catalyst layer, which may be a catalyst metal layer 216, for growing the carbon nanotube 230 is formed on the heating element 214.

The heating element 214 can be formed of one of Mo, W, SiC, and $MoSi_2$. Joule's heat is generated from the heating element 214 by applying a predetermined voltage to the electrode pads 212 connected to the heating element 214, and the Joule's heat heats the catalyst metal layer 216.

The substrate 202 under the heating element 214 is isotropically etched. The isotropical etching of the substrate 202 allows the heating element 214 to be separated from the substrate 202, and thus, waste of Joule's heat generated at the heating element 214 through the substrate 102 is prevented.

The carbon nanotube 230 is grown from the catalyst metal layer 216, and may be a single-walled carbon nanotube grown at a temperature of approximately 900 to 1,000° C.

Referring to FIGS. 7 and 9, the second electrode 220 includes two electrode pads 222 separated from the substrate 202 by the insulating layer 204 and a heating element 224 that connects the two electrode pads 222. A fixing layer which may be a low melting point metal layer 226 formed of, for example, Al or Cu is formed on the heating element 224. If the low melting point metal layer 226 is formed of, for example, Al, the low melting point metal layer 226 becomes fluid at a temperature lower than the melting point thereof by approximately 50 to 100° C., and fixes the carbon nanotube 230 by contacting an end of the carbon nanotube 230 grown from the catalyst metal layer 216.

The heating element 224 may be formed of the same material for forming the heating element 214. Joule's heat is generated from the heating element 224 by applying a predetermined voltage to the electrode pads 222 connected to the heating element 224, and the Joule's heat heats the low melting point metal layer 226.

The substrate 202 under the heating element 224 is isotropically etched. The isotropical etching of the substrate 202 allows the heating element 224 to be separated from the substrate 202.

Referring to FIGS. 7 and 10, a gate electrode 240 is formed on the substrate 202 below the carbon nanotube 230 between the first and second electrodes 210 and 220. The gate electrode 240 may be insulated from the substrate 202 by an insulating layer 203. The heating elements 214 and 224 are respectively separated from the substrate 202. Accordingly, the heating elements 214 and 224 are formed on the insulating layer 204, and have a bridge shape.

The catalyst metal layer 216 and the low melting point metal layer 226 are respectively formed on the heating elements 214 and 224. The carbon nanotube 230 connects the catalyst metal layer 216 and the low melting point metal layer 226.

FIGS. 11A through 11H are cross-sectional views illustrating a method of manufacturing a field effect transistor according to another embodiment of the present invention. Like reference numerals are used to indicate elements that are substantially identical to the elements of FIGS. 7 through 10, and thus the detailed description thereof will not be repeated. The manufacturing method will be explained with respect to FIG. 10, although electrode pads under heating elements are shown for convenience.

Figure 11A:
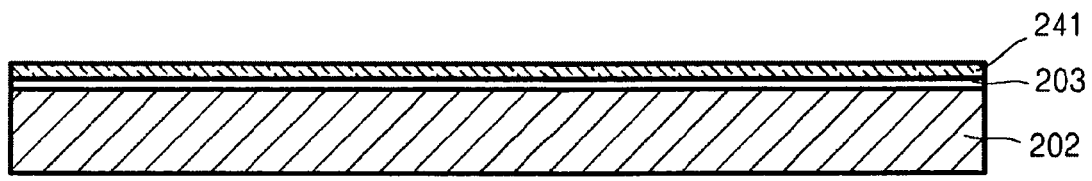
FIGS. 11A through 11H are cross-sectional views illustrating a method of manufacturing a field effect transistor according to another embodiment of the present invention.

Referring to FIG. 11A, a substrate 202, for example, a silicon substrate or a glass substrate is prepared. A first insulating layer 203 and a first electrode layer 241 are stacked on the substrate 202. The first electrode layer 241 can be formed of Al, Cr, Mo, or W. If the substrate 202 is a non-conductive layer, forming of the first insulating layer 203 may be omitted.

Figure 11B:
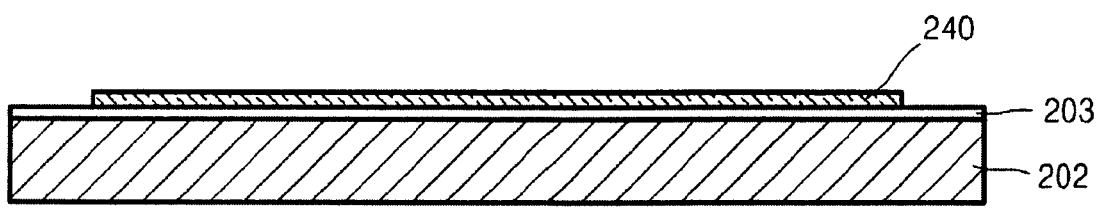

Referring to FIG. 11B, a gate electrode 240 is formed by patterning the first electrode layer 241.

Figure 11C:
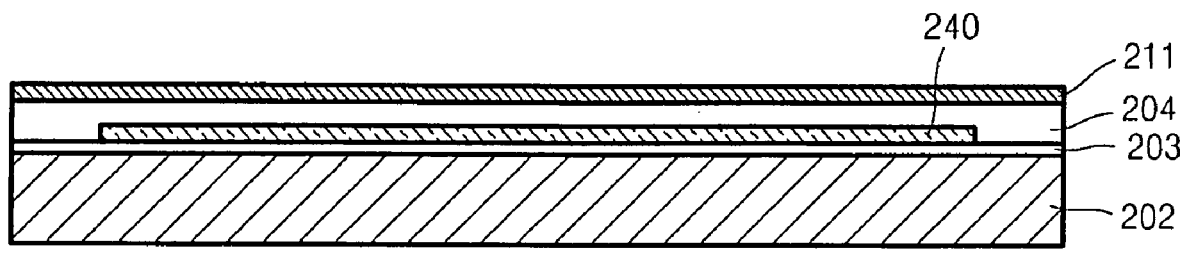

Referring to FIG. 11C, a second insulating layer 204 covering the gate electrode 240 is formed on the first insulating layer 203. The second insulating layer 204 is formed to have a thickness greater than that of the gate electrode 240. A second electrode layer 211 is formed on the second insulating layer 204.

Figure 11D:
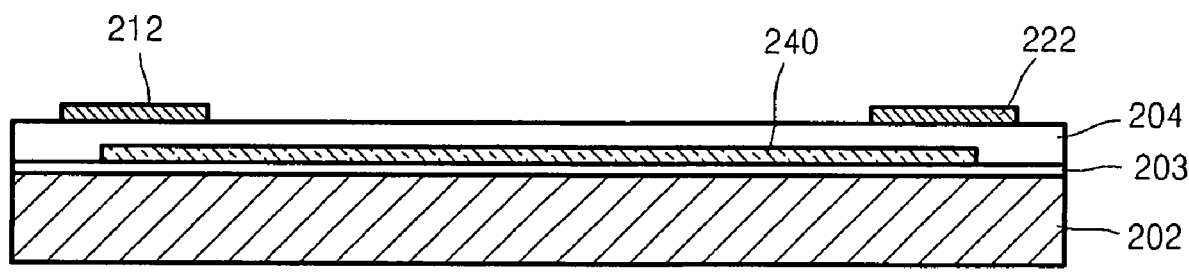

Referring to FIG. 11D, electrode pads 212 and 222 of first electrode 210 and second electrode 220 are formed by patterning the second electrode layer 211.

Figure 11E:
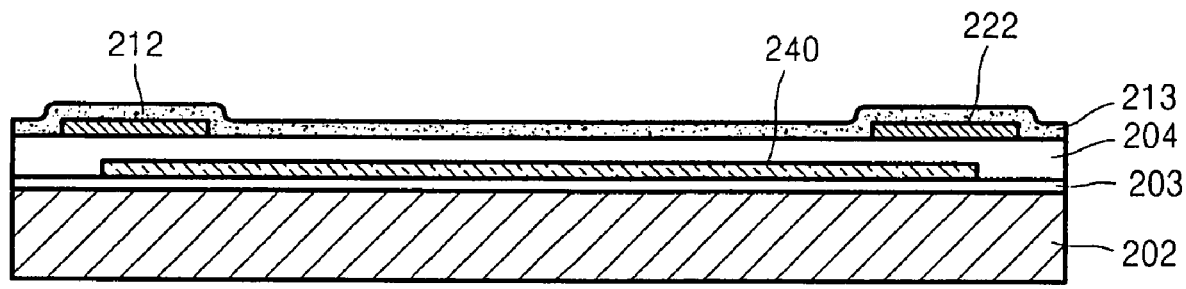

Referring to FIG. 11E, a heater layer 213 covering the electrode pads 212 and 222 is formed on the second insulating layer 204 using Mo, W, SiC, or $MoSi_2$. In this case, the heater layer 213 is formed of a material having wet etch selectivity with respect to a material for forming the second electrode layer 211. For example, if the second electrode layer 211 is formed of Cr, the heater layer 213 can be formed of Mo. Also, if the second electrode layer 211 is formed of Al, the heater layer 213 can be formed of $MoSi_2$.

Figure 11F:
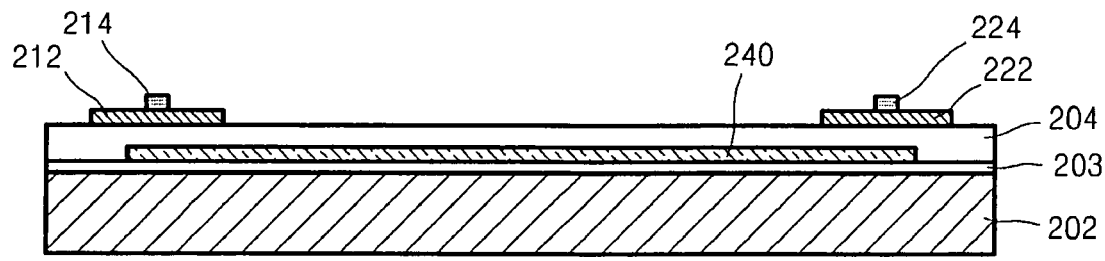

Referring to FIG. 11F, a heating element 214 connecting the pair of the electrode pads 212 and a heating element 224 connecting the pair of the electrode pads 222 are respectively formed by patterning the heater layer 213 (refer to FIGS. 8 and 9).

Figure 11G:
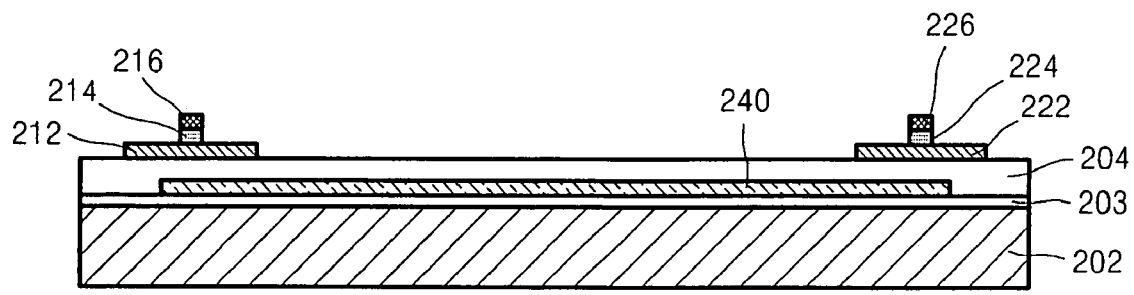

Referring to FIG. 11G, after forming a metal layer for catalyst (not shown) on the substrate 202 using a sputtering or e-beam evaporation method, a catalyst metal layer 216 is formed on the heating element 214 by patterning the metal layer for catalyst. The catalyst metal layer 216 can be formed of Ni, Fe, Co, or an alloy of these metals.

Next, after forming a metal layer having a low melting point (not shown) on the substrate using a sputtering or e-beam evaporation method, a low melting point metal layer 226 is formed on the heating element 224 by patterning the metal layer having low melting point. The low melting point metal layer 126 can be formed of Al or Cu. If the low melting point metal layer 226 does not have wet etch selectivity with respect to the electrode pads 212 and 222 and the heating elements 214 and 224, after a mask that exposes a region for forming the low melting point metal layer 226 is formed in advance, the low melting point metal layer 226 is deposited on the mask, and then, the mask can be lifted-off.

The catalyst metal layer 216 can also be formed using a lift-off process.

Figure 11H:
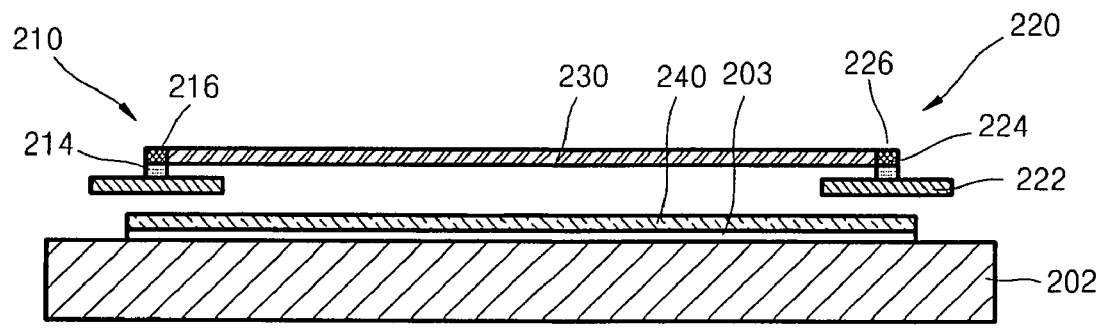

Referring to FIG. 11H, the first insulating layer 203, the second insulating layer 204 and the substrate 202 under the heating elements 214 and 224 are isotropically etched to a predetermined depth. The heating elements 214 and 224 are separated from the substrate 202 like a bridge (referring to FIGS. 8 and 9). The purpose of these etching is to form localized heating regions on the catalyst metal layer 216 and the low melting point metal layer 226 by preventing the flow of heat to the first insulating layer 203, the second insulating layer 204, and the substrate 202 when a current is applied to the heating elements 214 and 224.

Next, the substrate 202 is placed in a vacuum chamber (not shown). Afterwards, electric fields are formed between the heating elements 214 and 224 by respectively applying a predetermined DC voltage or a pulse voltage to each of the electrode pads 212 and 222 as depicted in FIG. 5. At the same time, the catalyst metal layer 216 on the heating element 214 is maintained at a temperature of approximately 1,000° C., and the low melting point metal layer 226 on the heating element 224 is maintained at a temperature lower than the melting point of the low melting point metal layer 226 by approximately 50 to 100° C. Next, the carbon nanotube 230 is horizontally grown from the catalyst metal layer 216 toward the low melting point metal layer 226 by blowing a hydrogen containing gas, for example, ethylene gas into the vacuum chamber. An end of the grown carbon nanotube 230 is fixed on the low melting point metal layer 226 when the carbon nanotube 230 contacts the low melting point metal layer 226.

At this point, the intensity of the electric field between the heating elements 214 and 224 may be approximately 1V/μm or higher.

In the method described above, the heating elements 214 and 224 and the electrode pads 212 and 222 of the first and the second electrodes 210 and 220 are formed of different materials from each other, but the present invention is not limited thereto. That is, when the electrode pads 212 and 222 of the first and the second electrodes 210 and 220 and the heating elements 214 and 224 are formed of the same material, for example, W or Mo, after forming a metal layer on an insulating layer, the electrode pads 212 and 222 and the heating elements 214 and 224 can be formed together by patterning the metal layer.

In an electronic device and a field effect transistor according to embodiments of the present invention, a carbon nanotube can be grown by heating a heating element at room temperature. Therefore, thermal damage to substrate and other devices can be prevented.

Also, since the carbon nanotube is fixed on a low melting point metal layer, an additional process for fixing the carbon nanotube is not required.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device comprising:
    a substrate;
    a first electrode formed on the substrate, the first electrode comprising:
    a couple of first electrode pads separated from each other;
    a first heating element connecting the couple of the first electrode pads to each other, the first heating element separated from the substrate; and
    a catalyst layer formed on the first heating element;

a second electrode formed on the substrate, the second electrode being in parallel to the first electrode, the second electrode comprising: a couple of second electrode pads separated from each other; and a second heating element that connects the couple of the second electrode pads to each other, the second heating element separated from the substrate; and a carbon nanotube grown from the catalyst layer, the carbon nanotube connecting the first electrode and the second electrode.

2. The electronic device of claim 1, wherein the second electrode further comprises a fixing layer formed on the second heating element of the second electrode to fix the end of the carbon nanotube grown from the catalyst layer.

3. The electronic device of claim 2, wherein the fixing layer comprises a low melting point metal layer.

4. The electronic device of claim 3, wherein the low melting point metal layer is formed of Al or Cu.

5. The electronic device of claim 1, wherein the first heating element and the second heating element are formed of material independently selected from the group consisting of Mo, W, SiC, and $MoSi_2$.

6. The electronic device of claim 1, wherein the couple of the first electrode pads, the couple of the second electrode pads, the first heating element and the second heating element are formed of the same material.

7. The electronic device of claim 1, wherein the catalyst layer comprises a catalyst metal layer comprised of Ni, Fe, Co, or an alloy thereof.

8. The electronic device of claim 1, wherein the carbon nanotube is a single walled-carbon nanotube.

9. A field effect transistor comprising the electronic device of claim 1, wherein the electronic device further comprises a gate electrode formed on the substrate.

10. A method of manufacturing an electronic device, comprising:
(a) forming a first electrode and a second electrode which are parallel to each other on a substrate, the first electrode comprising a couple of first electrode pads and a first heating element connecting the couple of the first electrode pads to each other, the second electrode comprising a couple of second electrode pads and a second heating element connecting the couple of the second electrode pads to each other;
(b) forming a catalyst layer on the first heating element of the first electrode;
(c) etching at least a portion of the substrate under the first and second heating elements of the first and second electrodes;
(d) forming an electric field directed from the first electrode towards the second electrode by respectively applying a predetermined voltage to each of the first and second electrode pads of the first and second electrodes in order to generate heat from the first heating element to heat the catalyst layer to a first temperature; and
(e) growing a carbon nanotube from the catalyst layer using a gas containing carbon atoms to be connected to the second electrode.

11. The method of claim 10, wherein the operation (b) further comprises forming a fixing layer on the second heating element of the second electrode to fix the end of the carbon nanotube grown from the catalyst layer;
the operation (d) further comprises heating the fixing layer to a second temperature which is lower than a melting point of the fixing layer; and
the operation (e) comprises fixing the carbon nanotube on the fixing layer such that an end of the carbon nanotube contacts the fixing layer.

12. The method of claim 11, wherein the fixing layer comprises a low melting point metal layer.

13. The method of claim 12, wherein the low melting point metal layer is formed of Al or Cu.

14. The method of claim 10, wherein the operation (d) comprises forming the electric field having an intensity of 1V/μm or higher.

15. The method of claim 10, wherein, in the operation (d), the first temperature is approximately 900to 1,000° C. and the operation (e) comprises forming a single-walled carbon nanotube.

16. The method of claim 10, wherein the first heating element and the second heating element are formed of material independently selected from the group consisting of Mo, W, SiC, and $MoSi_2$.

17. The method of claim 10, wherein the operation (a) comprises forming a metal layer and patterning the metal layer to form the couple of the first electrode pads, the couple of the second electrode pads, the first heating element and the second heating element.

18. The method of claim 10, wherein the catalyst layer comprises a catalyst metal layer comprised of Ni, Fe, Co, or an alloy thereof.

19. A method of manufacturing a field effect transistor, comprising:
(a) forming a gate electrode on a substrate;
(b) forming a first electrode and a second electrode which are parallel to each other on the substrate, the first electrode comprising a couple of first electrode pads and a first heating element connecting the couple of the first electrode pads to each other, the second electrode comprising a couple of the second electrode pads and a second heating element connecting the couple of the second electrode pads;
(c) forming a catalyst layer on the first heating element of the first electrode;
(d) etching at least a portion of the substrate under the first and second heating elements of the first and second electrodes;
(e) forming an electric field directed from the first electrode towards the second electrode by applying a respective predetermined voltage to each of the first and second electrode pads of the first and second electrodes in order to generate heat from the first heating element to heat the catalyst layer to a first temperature; and
(f) growing a carbon nanotube from the catalyst layer using a gas containing carbon atoms to be connected to the second electrode.

20. The method of claim 19, wherein
the operation (c) further comprises forming a fixing layer on the second heating element of the second electrode to fix the end of the carbon nanotube grown from the catalyst layer;
the operation (e) further comprises heating the fixing layer to a second temperature which is lower than a melting point, of the fixing layer; and
the operation (f) comprises fixing the carbon nanotube on the fixing layer such that an end of the carbon nanotube contacts the fixing layer.

21. The method of claim 20, wherein the fixing layer comprises a low melting point metal layer.

22. The method of claim 21, wherein the low melting point metal layer is formed of Al or Cu.

23. The method of claim 19, wherein the operation (e) is forming the electric field having an intensity of 1V/μm or higher.

24. The method of claim 19, wherein, in the operation (e), the first temperature is approximately 900 to 1,000° C. and the operation (f) comprises forming a single walled-carbon nanotube.

25. The method of claim 19, wherein the first heating element and the second heating element are formed of material independently selected from the group consisting of Mo, W, SiC, and $MoSi_2$.

26. The method of claim 19, wherein the operation (b) comprises forming a metal layer and patterning the metal layer to form the couple of the first electrode pads, the couple of the second electrode pads, the first heating element and the second heating element.

27. The method of claim 19, wherein the catalyst layer comprises a catalyst metal layer comprised of Ni, Fe, Co, or an alloy thereof.

* * * * *